（12） United States Patent
Barak et al.

(10) Patent No.: US 11,366,398 B2
(45) Date of Patent: Jun. 21, 2022

(54) TIME-DOMAIN OPTICAL METROLOGY AND INSPECTION OF SEMICONDUCTOR DEVICES

(71) Applicant: NOVA LTD., Rehovot (IL)

(72) Inventors: Gilad Barak, Rehovot (IL); Michael Chemama, Rehovot (IL); Smadar Ferber, Rehovot (IL); Yanir Hainick, Rehovot (IL); Boris Levant, Rehovot (IL); Ze'Ev Lindenfeld, Rehovot (IL); Dror Shafir, Rehovot (IL); Yuri Shirman, Rehovot (IL); Elad Schleifer, Rehovot (IL)

(73) Assignee: NOVA LTD, Rehovot (IL)

( * ) Notice: Subject to any disclaimer, the term of this patent is extended or adjusted under 35 U.S.C. 154(b) by 0 days.

(21) Appl. No.: 17/254,357

(22) PCT Filed: Jul. 18, 2019

(86) PCT No.: PCT/IB2019/056171
§ 371 (c)(1),
(2) Date: Dec. 21, 2020

(87) PCT Pub. No.: WO2020/021411
PCT Pub. Date: Jan. 30, 2020

(65) Prior Publication Data
US 2021/0247699 A1    Aug. 12, 2021

Related U.S. Application Data

(60) Provisional application No. 62/862,085, filed on Jun. 16, 2019, provisional application No. 62/699,788, filed on Jul. 18, 2018.

(51) Int. Cl.
*G03F 7/20* (2006.01)
*G01B 11/06* (2006.01)

(52) U.S. Cl.
CPC ...... *G03F 7/70625* (2013.01); *G01B 11/0625* (2013.01); *G01B 2210/56* (2013.01)

(58) Field of Classification Search
CPC ............ G03F 7/70625; G01B 11/0625; G01B 2210/56; G01B 9/02044; G06T 7/168
See application file for complete search history.

(56) References Cited

U.S. PATENT DOCUMENTS

| 7,408,649 B2* | 8/2008 | Freischlad ......... G01B 9/02057 356/497 |
| 7,480,047 B1 | 1/2009 | Ratner et al. |

(Continued)

FOREIGN PATENT DOCUMENTS

WO    2018/065756    4/2018

*Primary Examiner* — Rebecca C Bryant
(74) *Attorney, Agent, or Firm* — Daniel J. Swirsky; AlphaPatent Associates Ltd.

(57) ABSTRACT

Semiconductor device metrology including creating a time-domain representation of wavelength-domain measurement data of light reflected by a patterned structure of a semiconductor device, selecting an earlier-in-time portion of the time-domain representation that excludes a later-in-time portion of the time-domain representation, and determining one or more measurements of one or more parameters of interest of the patterned structure by performing model-based processing using the earlier-in-time portion of the time-domain representation.

16 Claims, 11 Drawing Sheets

(56) References Cited

U.S. PATENT DOCUMENTS

| | | |
|---|---|---|
| 8,798,966 B1 | 8/2014 | Hench et al. |
| 2007/0091317 A1 | 4/2007 | Freischlad et al. |
| 2015/0046118 A1 | 2/2015 | Pandev et al. |
| 2016/0153914 A1 | 6/2016 | Lange |

* cited by examiner

TIME-DOMAIN OPTICAL METROLOGY AND INSPECTION OF SEMICONDUCTOR DEVICES

CROSS-REFERENCE TO RELATED APPLICATIONS

This application is a U.S. National Phase Application under 35 U.S.C. 371 of International Application No. PCT/IB/2019/056171, which has an international filing date of Jul. 18, 2019, and which claims the benefit of priority from U.S. Provisional Patent Application No. 62/862,085, filed Jun. 16, 2019, and U.S. Provisional Patent Application No. 62/699,788, filed Jul. 18, 2018, the disclosures of which are incorporated herein by reference in their entirety.

BACKGROUND

Semiconductor devices, such as logic and memory devices, are typically fabricated by depositing a series of layers on a semiconductor wafer, where some or all of the layers include patterned structures. Optical scatterometry is often used to characterize properties of semiconductor devices by measuring light reflected by the various layers of a semiconductor device, and then interpreting the measured light spectra with respect to predefined models or other reference data. Optical scatterometry is particularly suited for use with semiconductor devices having only periodic patterned structures, such as is commonly the case with memory devices. However, some types of semiconductor devices have upper layers with periodic patterned structures, such as of memory circuitry, as well as lower layers with aperiodic structures, such as of logic circuitry, making it difficult or impossible to characterize properties of such devices using existing optical scatterometry techniques.

SUMMARY

In one aspect of the invention a method is provided for semiconductor device metrology, the method including creating a time-domain representation of wavelength-domain measurement data of light reflected by a patterned structure of a semiconductor device, selecting an earlier-in-time portion of the time-domain representation that excludes a later-in-time portion of the time-domain representation, and determining one or more measurements of one or more parameters of interest of the patterned structure by performing model-based processing using the earlier-in-time portion of the time-domain representation.

In another aspect of the invention the predefined model is configured for determining time-domain representations of theoretical wavelength-domain measurement data of light expected to be reflected by the patterned structure for corresponding theoretical measurements of the patterned structure.

In another aspect of the invention the predefined model models one or more upper layers of the patterned structure corresponding to the earlier-in-time portion of the time-domain representation.

In another aspect of the invention the predefined model models the one or more upper layers of the patterned structure excluding all other layers of the patterned structure.

In another aspect of the invention the wavelength-domain measurement data include spectral amplitude and spectral phase, and where the creating includes creating the time-domain representation using both the spectral amplitude and the spectral phase.

In another aspect of the invention a method is provided for semiconductor device metrology, the method including creating a time-domain representation of wavelength-domain measurement data of light reflected by a patterned structure of a semiconductor device, selecting an earlier-in-time portion of the time-domain representation that excludes a later-in-time portion of the time-domain representation, transforming the selected earlier-in-time portion of the time-domain representation into time-filtered wavelength-domain measurement data, and determining one or more measurements of one or more parameters of interest of the patterned structure by performing model-based processing using the time-filtered wavelength-domain measurement data.

In another aspect of the invention the predefined model is configured for determining theoretical wavelength-domain measurement data of light expected to be reflected by the patterned structure for corresponding theoretical measurements of the patterned structure.

In another aspect of the invention the predefined model models one or more upper layers of the patterned structure corresponding to the time-filtered wavelength-domain measurement data.

In another aspect of the invention the predefined model models the one or more upper layers of the patterned structure excluding all other layers of the patterned structure.

In another aspect of the invention the wavelength-domain measurement data include spectral amplitude and spectral phase, and where the creating includes creating the time-domain representation using both the spectral amplitude and the spectral phase.

In another aspect of the invention a method is provided for semiconductor device metrology, the method including creating a first time-domain representation of first wavelength-domain measurement data of light reflected by a first target location on a patterned structure of a semiconductor device, creating a second time-domain representation of second wavelength-domain measurement data of light reflected by a second target location on the patterned structure of the semiconductor device, identifying a first point in the first time-domain representation corresponding to a height of the first target location, identifying a second point in the second time-domain representation corresponding to a height of the second target location, and determining a height differential between the height of the first target location and the height of the second target location.

In another aspect of the invention the first wavelength-domain measurement data include spectral amplitude and spectral phase associated with the first target location, where the second wavelength-domain measurement data include spectral amplitude and spectral phase associated with the second target location, where the creating the first time-domain representation includes creating the first time-domain representation using both the spectral amplitude and the spectral phase of the first wavelength-domain measurement data, and where the creating the second time-domain representation includes creating the second time-domain representation using both the spectral amplitude and the spectral phase of the second wavelength-domain measurement data.

In another aspect of the invention a method is provided for semiconductor device inspection, the method including creating a time-domain representation of wavelength-domain measurement data of light reflected by a patterned structure of a semiconductor device, comparing the time-domain representation to a reference time-domain representation of light reflected by a reference patterned structure, and identifying a structural anomaly in the semiconductor device if a difference exists between the time-domain representations.

In another aspect of the invention the wavelength-domain measurement data include spectral amplitude and spectral phase, and where the creating includes creating the time-domain representation using both the spectral amplitude and the spectral phase.

In another aspect of the invention a system is provided for semiconductor device metrology, the system including a spectrum processing unit configured to create a time-domain representation of wavelength-domain measurement data of light reflected by a patterned structure of a semiconductor device, and select an earlier-in-time portion of the time-domain representation that excludes a later-in-time portion of the time-domain representation, and a metrology unit configured to determine one or more measurements of one or more parameters of interest of the patterned structure by performing model-based processing using the earlier-in-time portion of the time-domain representation, where the spectrum processing unit and the metrology unit are implemented in any of a) computer hardware, and b) computer software embodied in a non-transitory, computer-readable medium.

In another aspect of the invention the predefined model is configured for determining time-domain representations of theoretical wavelength-domain measurement data of light expected to be reflected by the patterned structure for corresponding theoretical measurements of the patterned structure.

In another aspect of the invention the predefined model models one or more upper layers of the patterned structure corresponding to the earlier-in-time portion of the time-domain representation.

In another aspect of the invention the predefined model models the one or more upper layers of the patterned structure excluding all other layers of the patterned structure.

In another aspect of the invention the wavelength-domain measurement data include spectral amplitude and spectral phase, and where the spectrum processing unit is configured to create the time-domain representation using both the spectral amplitude and the spectral phase.

In another aspect of the invention a system is provided for semiconductor device metrology, the system including a spectrum processing unit configured to create a time-domain representation of wavelength-domain measurement data of light reflected by a patterned structure of a semiconductor device, select an earlier-in-time portion of the time-domain representation that excludes a later-in-time portion of the time-domain representation, and transform the selected earlier-in-time portion of the time-domain representation into time-filtered wavelength-domain measurement data, and a metrology unit configured to determine one or more measurements of one or more parameters of interest of the patterned structure by performing model-based processing using the time-filtered wavelength-domain measurement data, where the spectrum processing unit and the metrology unit are implemented in any of a) computer hardware, and b) computer software embodied in a non-transitory, computer-readable medium.

In another aspect of the invention the predefined model is configured for determining theoretical wavelength-domain measurement data of light expected to be reflected by the patterned structure for corresponding theoretical measurements of the patterned structure.

In another aspect of the invention the predefined model models one or more upper layers of the patterned structure corresponding to the time-filtered wavelength-domain measurement data.

In another aspect of the invention the predefined model models the one or more upper layers of the patterned structure excluding all other layers of the patterned structure.

In another aspect of the invention the wavelength-domain measurement data include spectral amplitude and spectral phase, and where the spectrum processing unit is configured to create the time-domain representation using both the spectral amplitude and the spectral phase.

In another aspect of the invention a system is provided for semiconductor device metrology, the system including a spectrum processing unit configured to create a first time-domain representation of first wavelength-domain measurement data of light reflected by a first target location on a patterned structure of a semiconductor device, and create a second time-domain representation of second wavelength-domain measurement data of light reflected by a second target location on the patterned structure of the semiconductor device, and a metrology unit configured to identify a first point in the first time-domain representation corresponding to a height of the first target location, identify a second point in the second time-domain representation corresponding to a height of the second target location, and determine a height differential between the height of the first target location and the height of the second target location, where the spectrum processing unit and the metrology unit are implemented in any of a) computer hardware, and b) computer software embodied in a non-transitory, computer-readable medium.

In another aspect of the invention the first wavelength-domain measurement data include spectral amplitude and spectral phase associated with the first target location, where the second wavelength-domain measurement data include spectral amplitude and spectral phase associated with the second target location, where the spectrum processing unit is configured to create the first time-domain representation using both the spectral amplitude and the spectral phase of the wavelength-domain measurement data associated with the first target location, and where the spectrum processing unit is configured to create the second time-domain representation using both the spectral amplitude and the spectral phase of the wavelength-domain measurement data associated with the second target location.

In another aspect of the invention a system is provided for semiconductor device inspection, the system including a spectrum processing unit configured to create a time-domain representation of wavelength-domain measurement data of light reflected by a patterned structure of a semiconductor device, and a structural anomaly detector configured to compare the time-domain representation to a reference time-domain representation of light reflected by a reference patterned structure, and identify a structural anomaly in the semiconductor device if a difference exists between the time-domain representations, where the spectrum processing unit and the structural anomaly detector are implemented in any of a) computer hardware, and b) computer software embodied in a non-transitory, computer-readable medium.

In another aspect of the invention the wavelength-domain measurement data include spectral amplitude and spectral phase, and where the spectrum processing unit is configured to create the time-domain representation using both the spectral amplitude and the spectral phase.

BRIEF DESCRIPTION OF THE DRAWINGS

Aspects of the invention will be understood and appreciated more fully from the following detailed description taken in conjunction with the appended drawings in which.

DETAILED DESCRIPTION

Figure 1A:
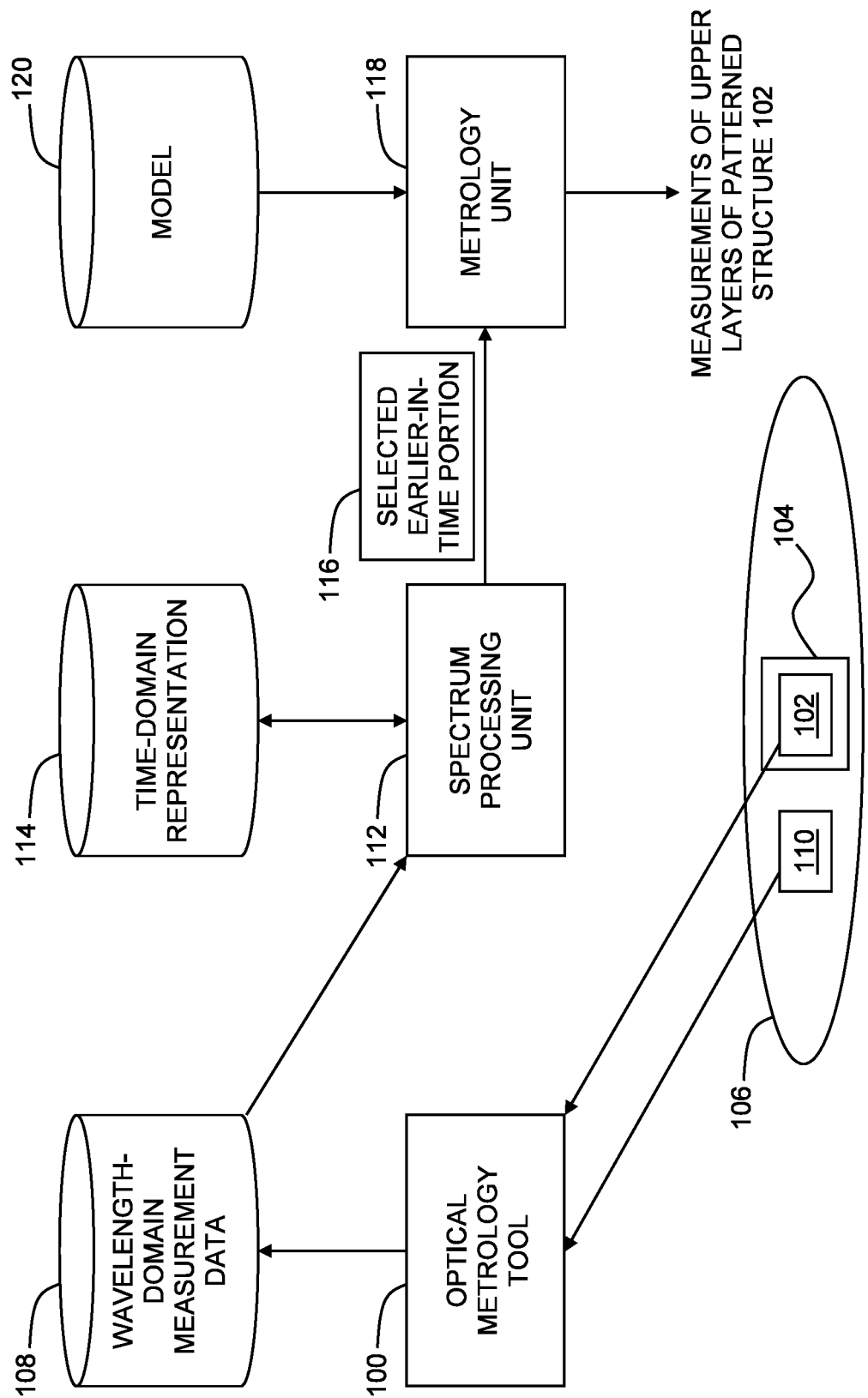
FIGS. 1A-1D, taken together, is a simplified conceptual illustration of a system for time-domain optical metrology and inspection of semiconductor devices, constructed and operative in accordance with an embodiment of the invention.

Reference is now made to FIGS. 1A-1D which, taken together, is a simplified conceptual illustration of a system for time-domain optical metrology and inspection of semiconductor devices, constructed and operative in accordance with an embodiment of the invention. In the system of FIG. 1A, an optical metrology tool 100, such as PRIZM™, commercially available from Nova Measuring Instruments, Ltd. of Rehovot, Israel, or as is otherwise described in U.S. Pat. No. 10,161,885, is employed to measure, in accordance with conventional techniques, light reflected by a patterned structure 102 of a semiconductor device 104, such as on a semiconductor wafer 106, and produce corresponding wavelength-domain measurement data 108 that preferably include both spectral amplitude and spectral phase of the reflected light. Optical metrology tool 100 measures the light reflected by patterned structure 102 at any selected point during or after fabrication of patterned structure 102.

Figure 2A:
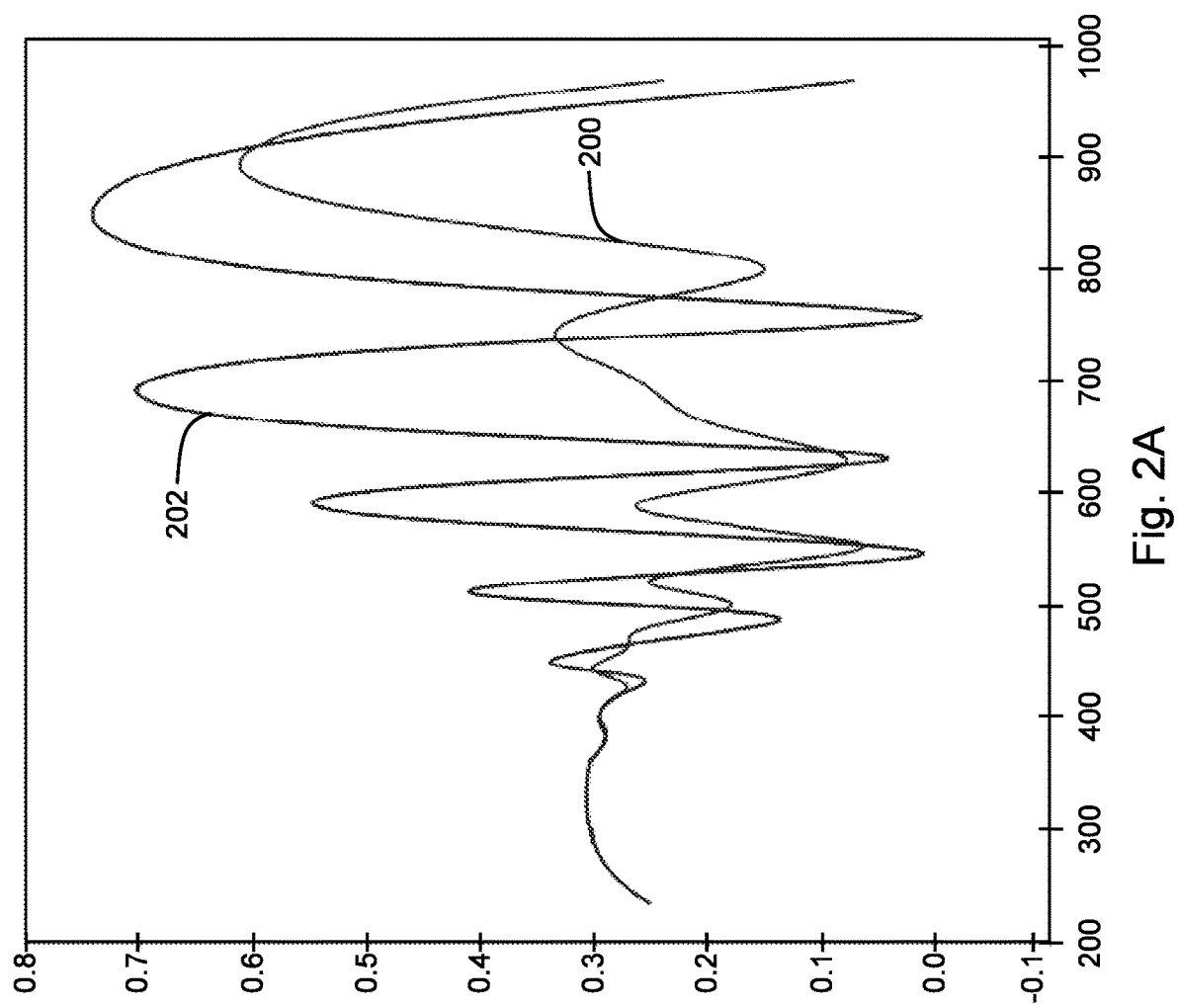
FIGS. 2A-2C are simplified graphical illustrations useful in understanding embodiments of the invention.

An example of wavelength-domain measurement data 108 is shown in FIG. 2A which shows a spectral reflectance graph 200, such as of patterned structure 102. A spectral reflectance graph 202 is also shown of a comparison patterned structure that acts as a reference to which patterned structure 102 is compared. The comparison patterned structure may be a "test" patterned structure 110 that is also located on semiconductor device 104, where spectral reflectance graph 202 is produced in the same manner as spectral reflectance graph 200. Although the graphs are substantially identical up to approximately 430 nm, they differ quite significantly thereafter.

Also shown in FIG. 1A is a spectrum processing unit 112, which is preferably integrated into optical metrology tool 100. Spectrum processing unit 112 is preferably configured to create a time-domain representation 114 of wavelength-domain measurement data 108 in accordance with conventional techniques, such as by using both the spectral amplitude and the spectral phase of wavelength-domain measurement data 108.

Figure 2B:
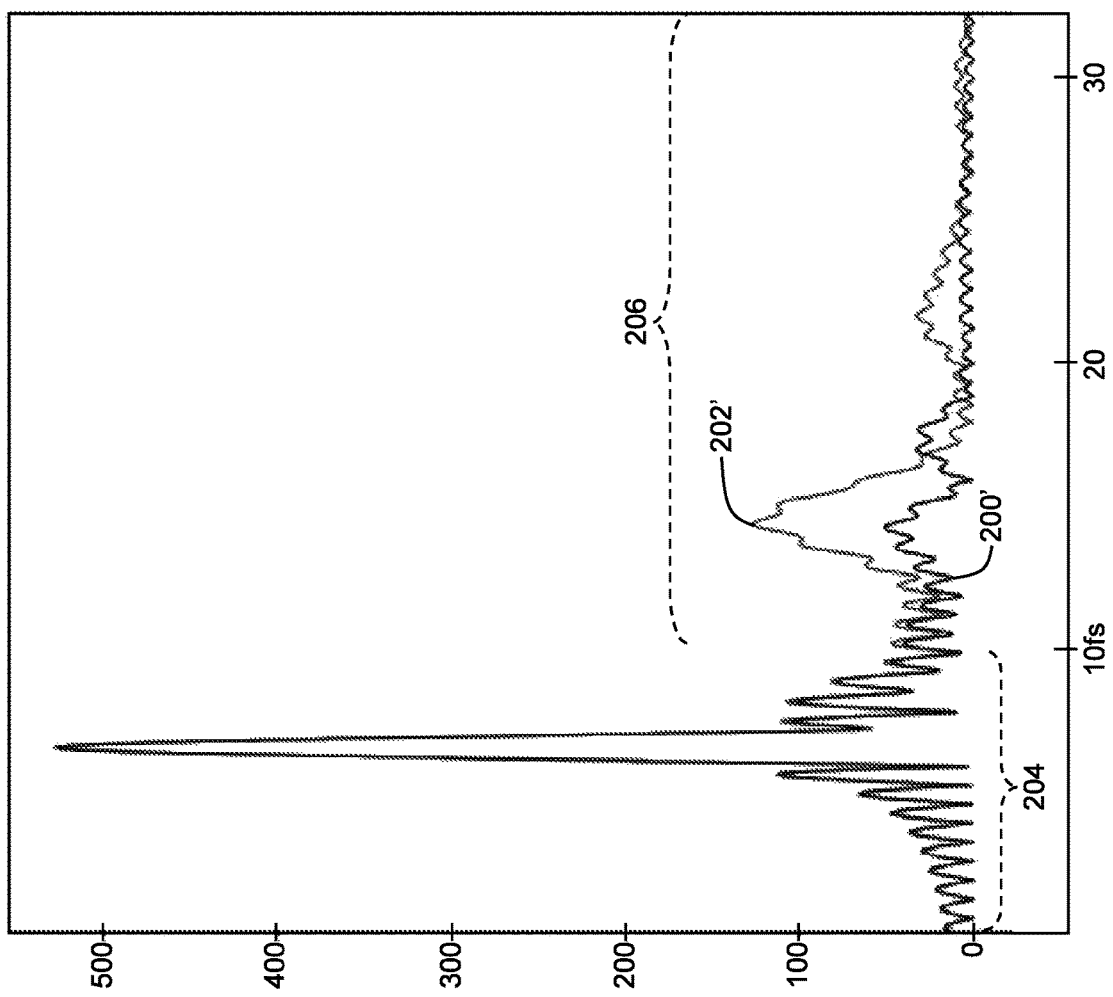

FIG. 2B shows a time-domain representation 200' of spectral reflectance graph 200, representing the time at which reflected light is received by optical metrology tool 100 after illuminating patterned structure 102. A time-domain representation 202' of spectral reflectance graph 202 is also shown for comparison. Here the graphs are substantially identical up to approximately 10 femtoseconds along the X axis (the Y axis representing signal amplitude in any known type of units in time domain), indicating that upper layers of patterned structure 102 and of test patterned structure 110, that reflect light sooner than lower layers, are likewise substantially identical.

Spectrum processing unit 112 of FIG. 1A is preferably configured to select an earlier-in-time portion 116 of time-domain representation 114 that excludes a later-in-time portion of time-domain representation 114. The selection may be indicated to spectrum processing unit 112 by a human operator, or may be performed automatically by spectrum processing unit 112 in accordance with predefined criteria, such as by selecting as earlier-in-time portion 116 the portion of time-domain representation 114 that includes only the first n femtoseconds of reflected light, where n may be any predefined value. Thus, for example, spectrum processing unit 112 may select an earlier-in-time portion 204 of time-domain representation 200' in FIG. 2B that excludes a later-in-time portion 206 of time-domain representation 200'.

Also shown in FIG. 1A is a metrology unit 118, which is preferably integrated into optical metrology tool 100. In one embodiment, metrology unit 118 is configured to determine one or more measurements of parameters of interest (e.g., OCD, SWA, height, etc.) of patterned structure 102 by performing model-based processing using the selected earlier-in-time portion 116 of time-domain representation 114 of wavelength-domain measurement data 108. In this embodiment a predefined model 120 is configured for determining time-domain representations of theoretical wavelength-domain measurement data of light expected to be reflected by patterned structure 102 for corresponding theoretical measurements of patterned structure 102. Predefined model 120 preferably models one or more upper layers of patterned structure 102 corresponding to the selected earlier-in-time portion 116 of time-domain representation 114, and predefined model 120 preferably excludes all other layers of patterned structure 102. The model-based processing preferably employs model fitting techniques, such as is commonly used in semiconductor metrology, using predefined model 120 to determine a set of theoretical measurements of patterned structure 102 that would result in a model-based time-domain representation of theoretical wavelength-domain measurement data of light expected to be reflected by patterned structure 102 given the set of theoretical measurements, and thereby actual determine measurements of patterned structure 102 where the model-based time-domain representation is substantially identical, within predefined tolerances, to selected earlier-in-time portion 116 of time-domain representation 114.

Figure 1B:
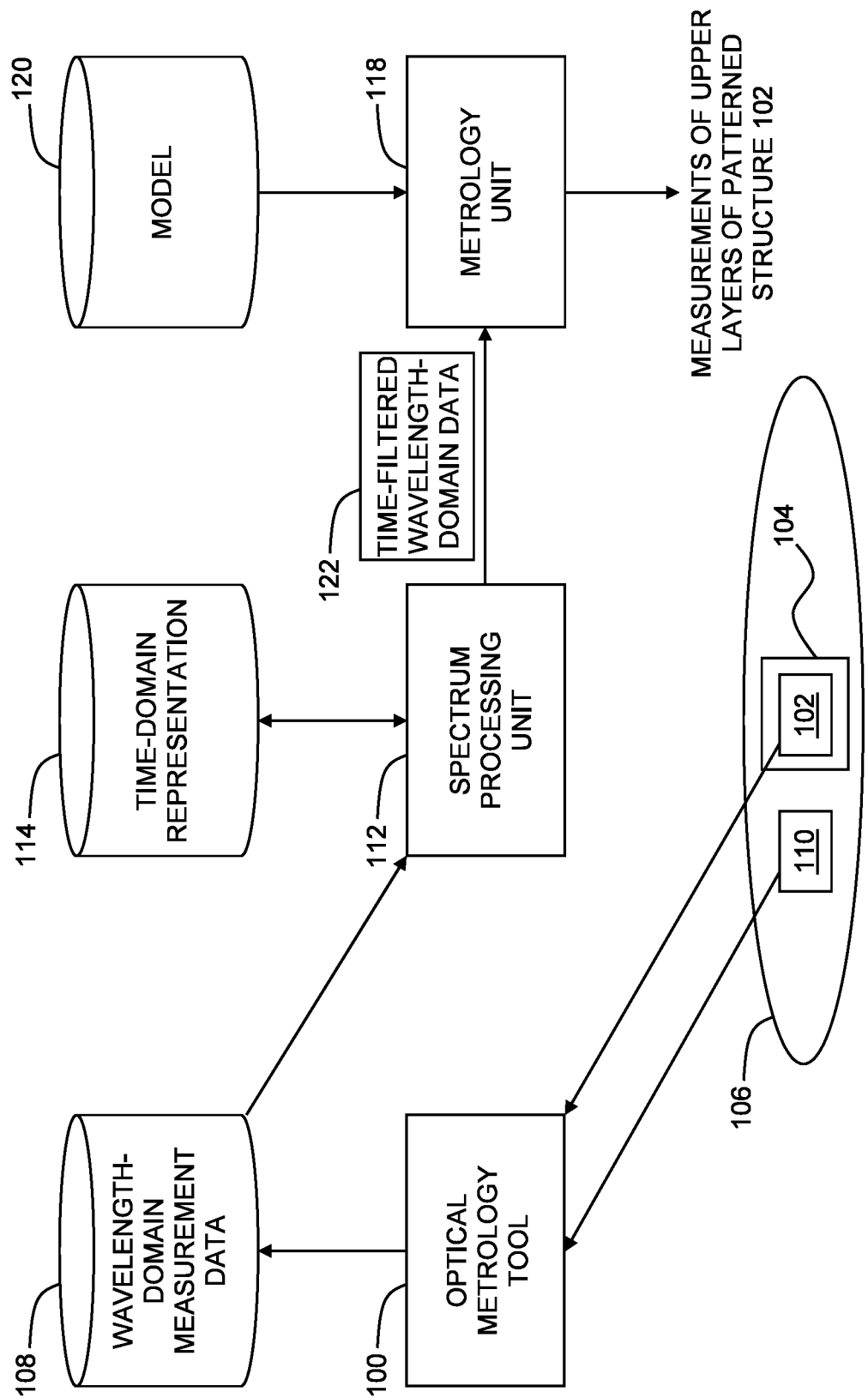

In another embodiment shown in FIG. 1B, spectrum processing unit 112 transforms selected earlier-in-time portion 116 of time-domain representation 114 into time-filtered wavelength-domain measurement data 122. Metrology unit 118 then determines one or more measurements of patterned structure 102 by performing model-based processing using the time-filtered wavelength-domain measurement data 122. In this embodiment predefined model 120 is configured for determining theoretical wavelength-domain measurement data of light expected to be reflected by patterned structure 102 for corresponding theoretical measurements of patterned structure 102. Predefined model 120 preferably models one or more upper layers of patterned structure 102 corresponding to time-filtered wavelength-domain measurement data 122, and predefined model 120 preferably excludes all other layers of patterned structure 102.

In another embodiment shown in FIG. 1C, optical metrology tool 100 is employed to measure light reflected by a first target location 124 on patterned structure 102 and produce corresponding wavelength-domain measurement data 126 as described hereinabove. Optical metrology tool 100 is then employed to measure light reflected by a second target location 128 on patterned structure 102 and produce corresponding wavelength-domain measurement data 130 as described hereinabove. An example of first target location 124 and second target location 128 is shown in FIG. 2C which shows a VNAND staircase application in which an ONO (SiO$_2$/SiN/SiO$_2$) staircase 208 is shown filled with SiO$_2$ 210. As chemical-mechanical polishing (CMP) is to be performed to the top of the staircase at 212, the above measurements of first target location 124 and second target location 128 are taken at a first target location 214 and a second target location 216 respectively, where second target location 216 is preferably just above the top of the staircase 212.

Spectrum processing unit 112 creates a first time-domain representation 132 of first wavelength-domain measurement data 126 of light reflected by first target location 124, and a second time-domain representation 134 of second wavelength-domain measurement data 130 of light reflected by second target location 128. If first target location 124 and second target location 128 are of different heights, their reflected light will appear at different time points in their time-domain representations provided the position of the reference mirror is the same when measuring both target locations 124 and 128. Metrology unit 118 is configured to identify a first point in first time-domain representation 132 corresponding to the height of first target location 124, and a second point in second time-domain representation 134 corresponding to the height of second target location 128. Metrology unit 118 then determines the height differential between the height of the first target location and the height of the second target location, which information may be used to control CMP of ONO staircase 208.

In another embodiment shown in FIG. 1D, optical metrology tool 100 is employed as described hereinabove to measure light reflected by patterned structure 102 of semiconductor device 104 and produce corresponding wavelength-domain measurement data 108 from which spectrum processing unit 112 creates time-domain representation 114. A structural anomaly detector 136, which is preferably integrated into optical metrology tool 100, is configured to compare time-domain representation 114 to a reference time-domain representation 138, such as of light reflected by a reference patterned structure, and identify a structural anomaly, such as a void or other structural defect, in semiconductor device 104 if a difference exists between time-domain representations 114 and 138.

Figure 3A:
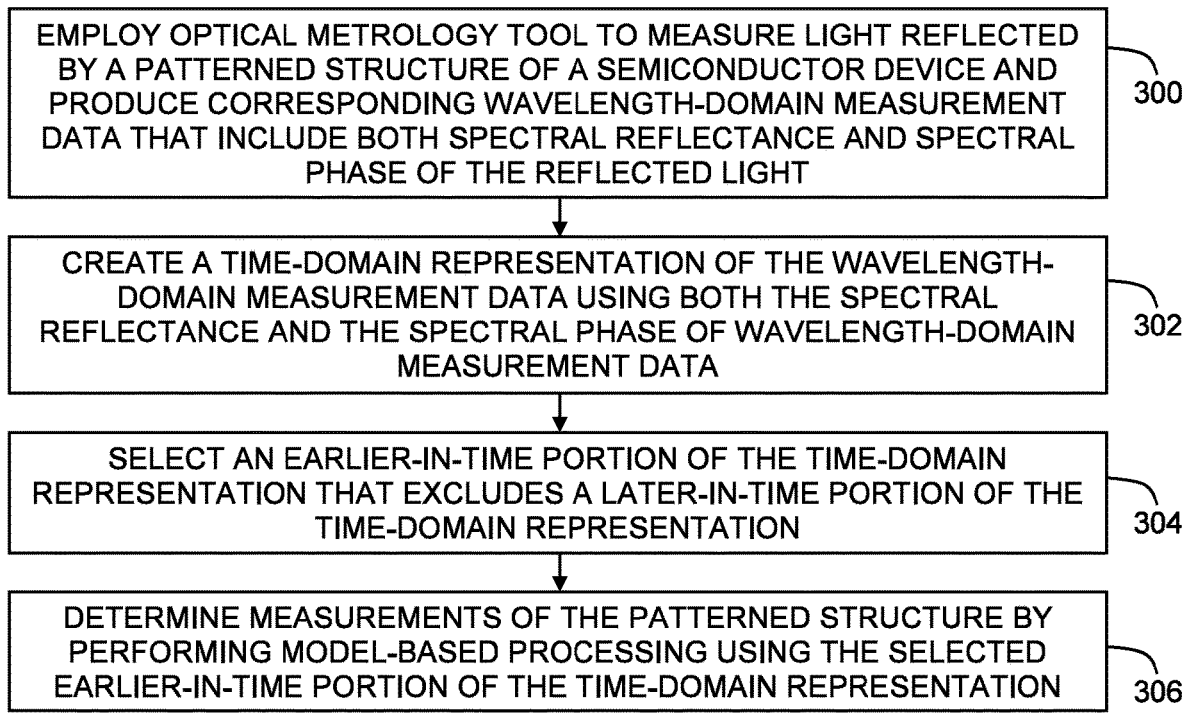
FIGS. 3A-3D are simplified flowchart illustrations of exemplary methods of operation of the systems of FIGS. 1A-1D.

Reference is now made to FIG. 3A which is a simplified flowchart illustration of an exemplary method of operation of the system of FIG. 1A, operative in accordance with an embodiment of the invention. In the method of FIG. 3A, an optical metrology tool is employed to measure light reflected by a patterned structure of a semiconductor device and produce corresponding wavelength-domain measurement data that include both spectral amplitude and spectral phase of the reflected light (step 300). A time-domain representation of the wavelength-domain measurement data is created using both the spectral amplitude and the spectral phase of wavelength-domain measurement data (step 302). An earlier-in-time portion of the time-domain representation is selected that excludes a later-in-time portion of the time-domain representation (step 304). Measurements of the patterned structure are determined by performing model-based processing using the selected earlier-in-time portion of the time-domain representation (step 306).

Figure 3B:
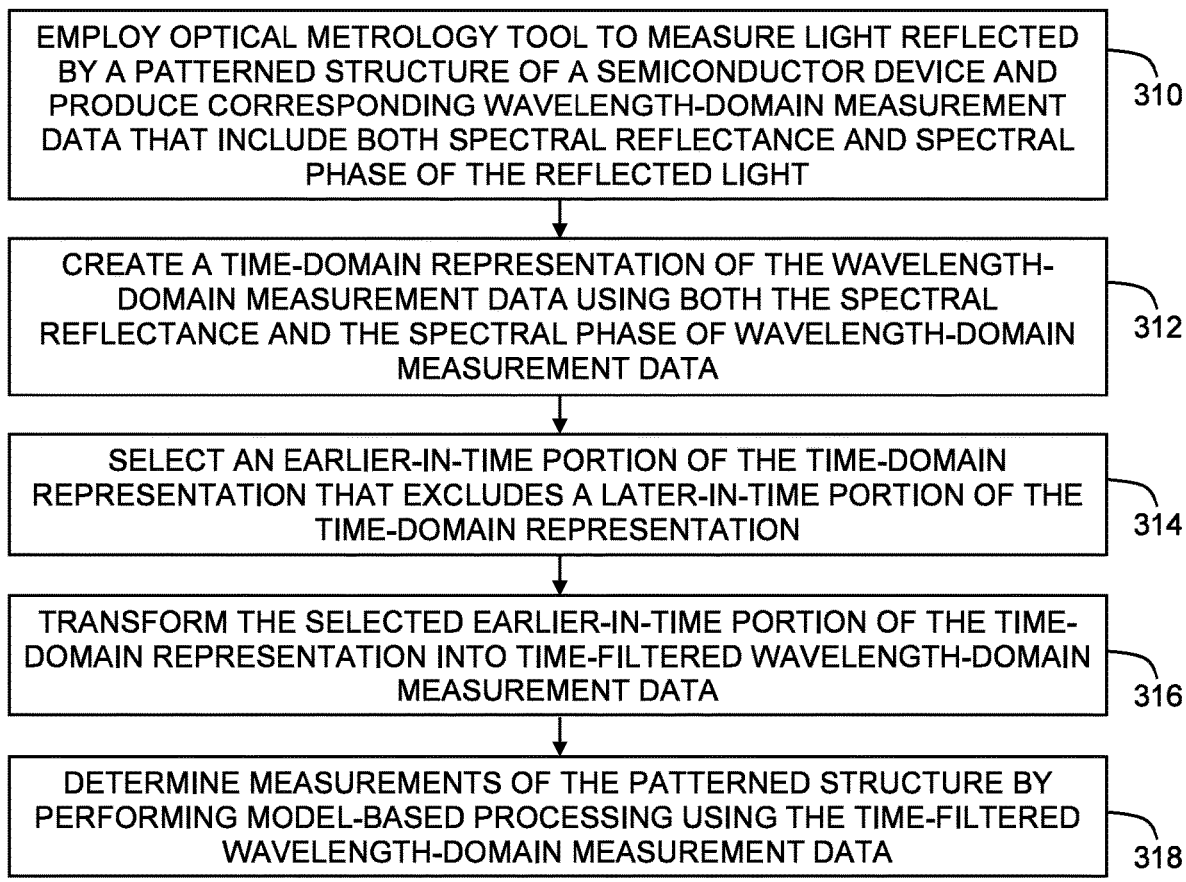

Reference is now made to FIG. 3B which is a simplified flowchart illustration of an exemplary method of operation of the system of FIG. 1B, operative in accordance with an embodiment of the invention. In the method of FIG. 3B, an optical metrology tool is employed to measure light reflected by a patterned structure of a semiconductor device and produce corresponding wavelength-domain measurement data that include both spectral amplitude and spectral phase of the reflected light (step 310). A time-domain representation of the wavelength-domain measurement data is created using both the spectral amplitude and the spectral phase of wavelength-domain measurement data (step 312). An earlier-in-time portion of the time-domain representation is selected that excludes a later-in-time portion of the time-domain representation (step 314). The selected earlier-in-time portion of the time-domain representation is transformed into time-filtered wavelength-domain measurement data (step 316). Measurements of the patterned structure are determined by performing model-based processing using the time-filtered wavelength-domain measurement data (step 318).

Figure 1C:
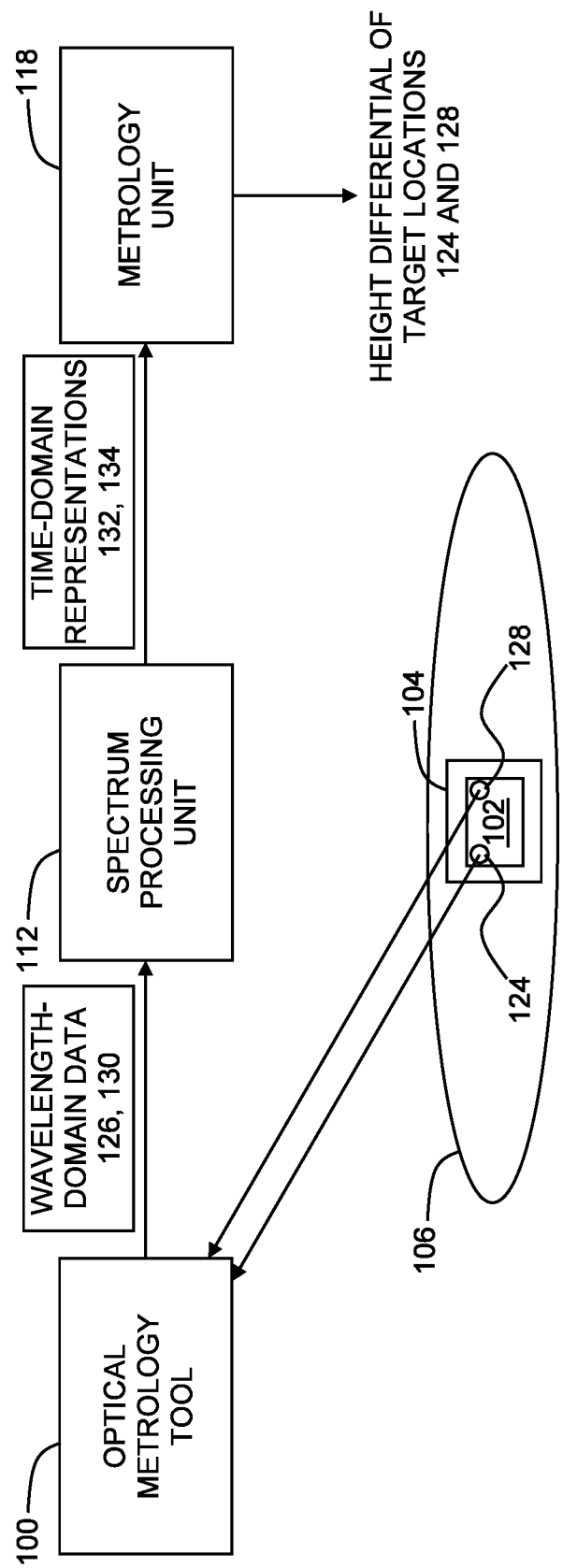
Figure 2C:
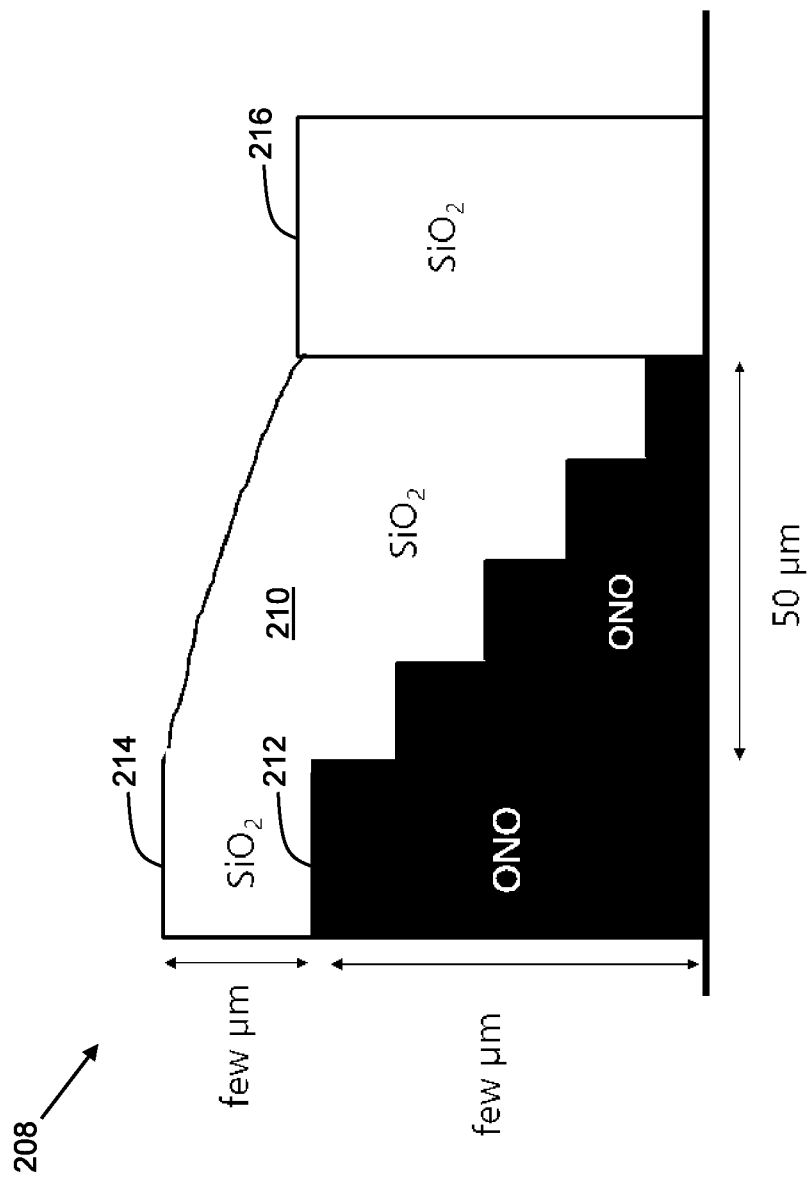
Figure 3C:
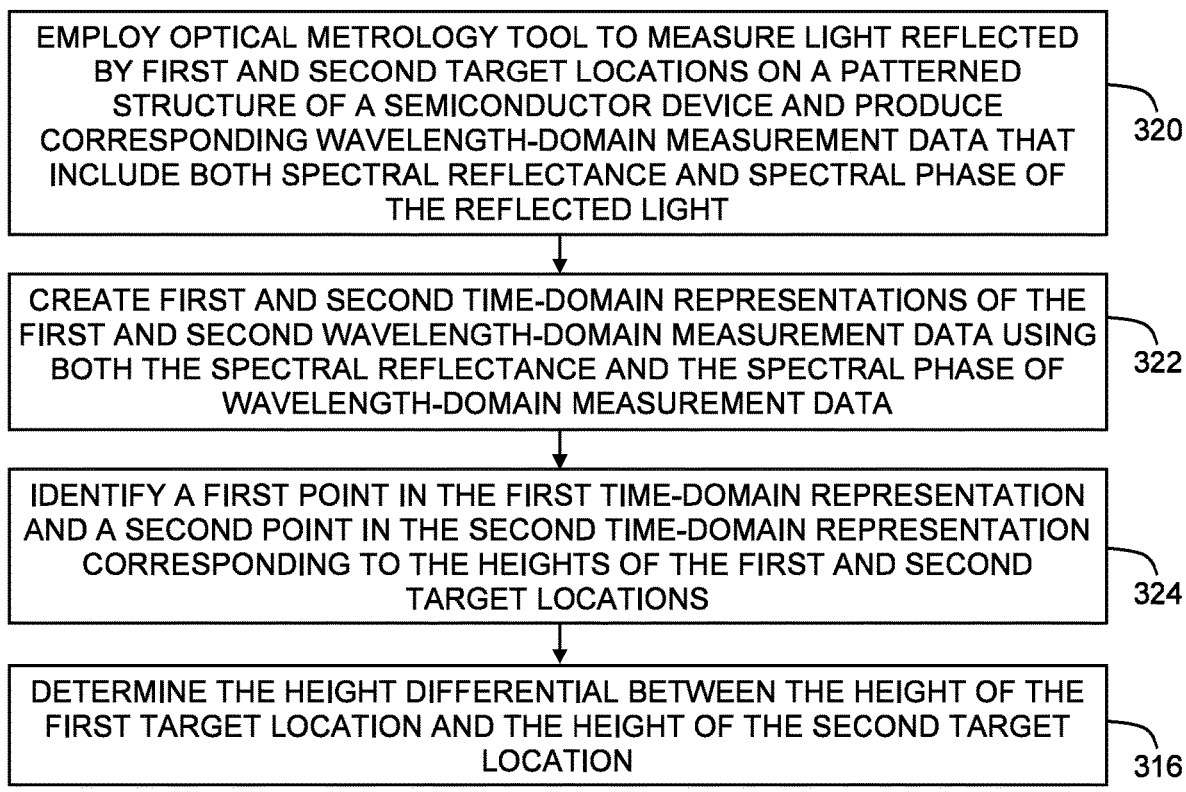

Reference is now made to FIG. 3C which is a simplified flowchart illustration of an exemplary method of operation of the system of FIG. 1C, operative in accordance with an embodiment of the invention. In the method of FIG. 3C, an optical metrology tool is employed to measure light reflected by first and second target locations on a patterned structure of a semiconductor device and produce corresponding first and second wavelength-domain measurement data that include both spectral amplitude and spectral phase of the reflected light (step 320). First and second time-domain representations are created of the first and second wavelength-domain measurement data using both the spectral amplitude and the spectral phase of wavelength-domain measurement data (step 322). A first point in the first time-domain representation and a second point in the second time-domain representation are identified corresponding to the heights of the first and second target locations (step 324). The height differential between the height of the first target location and the height of the second target location is then determined (step 326).

Figure 1D:
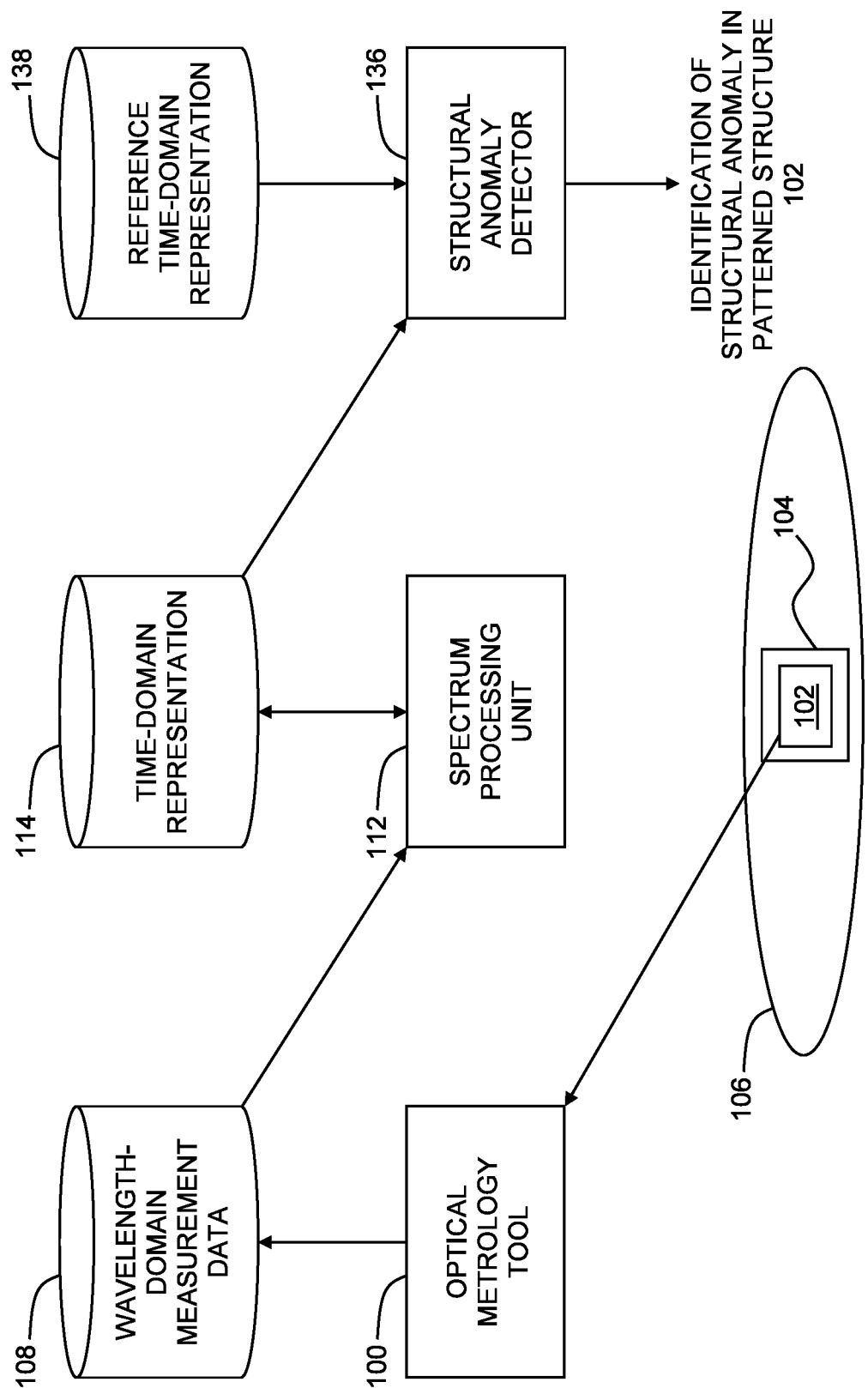
Figure 3D:
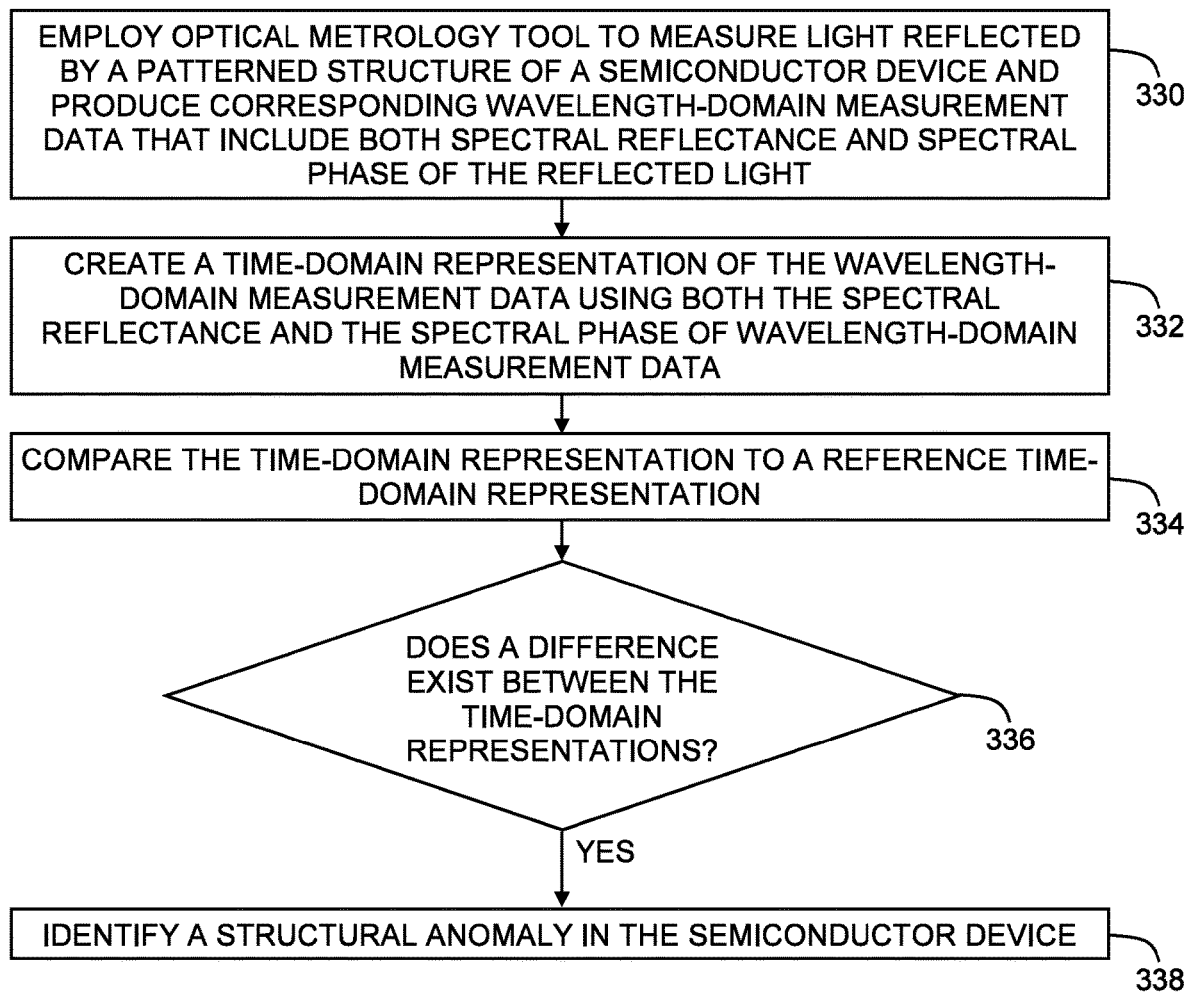

Reference is now made to FIG. 3D which is a simplified flowchart illustration of an exemplary method of operation of the system of FIG. 1D, operative in accordance with an embodiment of the invention. In the method of FIG. 3D, an optical metrology tool is employed to measure light reflected by a patterned structure of a semiconductor device and produce corresponding wavelength-domain measurement data that include both spectral amplitude and spectral phase of the reflected light (step 330). A time-domain representation of the wavelength-domain measurement data is created using both the spectral amplitude and the spectral phase of wavelength-domain measurement data (step 332). The time-domain representation is compared to a reference time-domain representation (step 334). If a difference exists between the time-domain representations (step 336), a structural anomaly is identified in the semiconductor device (step 338).

Any aspect of the invention described herein may be implemented in computer hardware and/or computer software embodied in a non-transitory, computer-readable medium in accordance with conventional techniques, the computer hardware including one or more computer processors, computer memories, I/O devices, and network interfaces that interoperate in accordance with conventional techniques.

It is to be appreciated that the term "processor" or "device" as used herein is intended to include any processing device, such as, for example, one that includes a CPU (central processing unit) and/or other processing circuitry. It is also to be understood that the term "processor" or "device" may refer to more than one processing device and that various elements associated with a processing device may be shared by other processing devices.

The term "memory" as used herein is intended to include memory associated with a processor or CPU, such as, for example, RAM, ROM, a fixed memory device (e.g., hard drive), a removable memory device (e.g., diskette), flash memory, etc. Such memory may be considered a computer readable storage medium.

In addition, the phrase "input/output devices" or "I/O devices" as used herein is intended to include, for example, one or more input devices (e.g., keyboard, mouse, scanner, etc.) for entering data to the processing unit, and/or one or more output devices (e.g., speaker, display, printer, etc.) for presenting results associated with the processing unit.

Embodiments of the invention may include a system, a method, and/or a computer program product. The computer program product may include a computer readable storage medium (or media) having computer readable program instructions thereon for causing a processor to carry out aspects of the invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the invention.

Aspects of the invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart illustrations and block diagrams in the drawing figures illustrate the architecture, functionality, and operation of possible implementations of systems, methods, and computer program products according to various embodiments of the invention. In this regard, each block in the flowchart illustrations or block diagrams may represent a module, segment, or portion of computer instructions, which comprises one or more executable computer instructions for implementing the specified logical function(s). In some alternative implementations, the functions noted in a block may occur out of the order noted in the drawing figures. For example, two blocks shown in succession may, in fact, be executed substantially concurrently, or the blocks may sometimes be executed in the reverse order, depending upon the functionality involved. It will also be noted that each block of the flowchart illustrations and block diagrams, and combinations of such blocks, can be implemented by special-purpose hardware-based and/or software-based systems that perform the specified functions or acts.

The descriptions of the various embodiments of the invention have been presented for purposes of illustration, but are not intended to be exhaustive or limited to the embodiments disclosed. For example, the systems and methods described herein are applicable to any type of structure on semiconductor wafers. Many modifications and variations will be apparent to those of ordinary skill in the art without departing from the scope and spirit of the described embodiments.

What is claimed is:

1. A method for semiconductor device metrology, the method comprising:
   creating a time-domain representation of wavelength-domain measurement data of light reflected by a patterned structure of a semiconductor device;
   selecting an earlier-in-time portion of the time-domain representation that excludes a later-in-time portion of the time-domain representation; and
   determining one or more measurements of one or more parameters of interest of the patterned structure by performing model fitting using a predefined model of the patterned structure to determine a set of theoretical measurements of the patterned structure that would result in a theoretical time-domain representation of wavelength-domain measurement data of light expected to be reflected by the patterned structure given the set of theoretical measurements, where the theoretical time-domain representation is substantially identical, within predefined tolerances, to the earlier-in-time portion of the time-domain representation.

2. The method according to claim 1 wherein the predefined model models one or more upper layers of the patterned structure corresponding to the earlier-in-time portion of the time-domain representation.

3. The method according to claim 2 wherein the predefined model models the one or more upper layers of the patterned structure excluding all other layers of the patterned structure.

4. The method according to claim 1 wherein the wavelength-domain measurement data include spectral amplitude and spectral phase, and wherein the creating comprises creating the time-domain representation using both the spectral amplitude and the spectral phase.

5. A method for semiconductor device metrology, the method comprising:
   creating a time-domain representation of wavelength-domain measurement data of light reflected by a patterned structure of a semiconductor device;
   selecting an earlier-in-time portion of the time-domain representation that excludes a later-in-time portion of the time-domain representation;
   transforming the selected earlier-in-time portion of the time-domain representation into time-filtered wavelength-domain measurement data; and
   determining one or more measurements of one or more parameters of interest of the patterned structure by performing model fitting using a predefined model of the patterned structure to determine a set of theoretical measurements of the patterned structure that would result in a theoretical wavelength-domain measurement data of light expected to be reflected by the patterned structure given the set of theoretical measurements, where the theoretical wavelength-domain representation is substantially identical, within predefined tolerances, to the time-filtered wavelength-domain measurement data.

6. The method according to claim 5 wherein the predefined model models one or more upper layers of the patterned structure corresponding to the time-filtered wavelength-domain measurement data.

7. The method according to claim 6 wherein the predefined model models the one or more upper layers of the patterned structure excluding all other layers of the patterned structure.

8. The method according to claim 5 wherein the wavelength-domain measurement data include spectral amplitude and spectral phase, and wherein the creating comprises creating the time-domain representation using both the spectral amplitude and the spectral phase.

9. A system for semiconductor device metrology, the system comprising:
   a spectrum processing unit configured to
      create a time-domain representation of wavelength-domain measurement data of light reflected by a patterned structure of a semiconductor device, and
      select an earlier-in-time portion of the time-domain representation that excludes a later-in-time portion of the time-domain representation; and
   a metrology unit configured to determine one or more measurements of one or more parameters of interest of the patterned structure by performing model fitting using a predefined model of the patterned structure to determine a set of theoretical measurements of the patterned structure that would result in a theoretical time-domain representation of wavelength-domain measurement data of light expected to be reflected by the patterned structure given the set of theoretical measurements, where the theoretical time-domain representation is substantially identical, within predefined tolerances, to the earlier-in-time portion of the time-domain representation,
   wherein the spectrum processing unit and the metrology unit are implemented in any of
      a) computer hardware, and
      b) computer software embodied in a non-transitory, computer-readable medium.

10. The system according to claim 9 wherein the predefined model models one or more upper layers of the patterned structure corresponding to the earlier-in-time portion of the time-domain representation.

11. The system according to claim 10 wherein the predefined model models the one or more upper layers of the patterned structure excluding all other layers of the patterned structure.

12. The system according to claim 9 wherein the wavelength-domain measurement data include spectral amplitude and spectral phase, and wherein the spectrum processing unit is configured to create the time-domain representation using both the spectral amplitude and the spectral phase.

13. A system for semiconductor device metrology, the system comprising:
   a spectrum processing unit configured to
      create a time-domain representation of wavelength-domain measurement data of light reflected by a patterned structure of a semiconductor device, select an earlier-in-time portion of the time-domain representation that excludes a later-in-time portion of the time-domain representation, and transform the selected earlier-in-time portion of the time-domain representation into time-filtered wavelength-domain measurement data; and a metrology unit configured to determine one or more measurements of one or more parameters of interest of the patterned structure by performing model fitting using a predefined model of the patterned structure to determine a set of theoretical measurements of the patterned structure that would result in a theoretical wavelength-domain measurement data of light expected to be reflected by the patterned structure given the set of theoretical measurements, where the theoretical wavelength-domain representation is substantially identical, within predefined tolerances, to the time-filtered wavelength-domain measurement data, wherein the spectrum processing unit and the metrology unit are implemented in any of
a) computer hardware, and
b) computer software embodied in a non-transitory, computer-readable medium.

14. The system according to claim 13 wherein the predefined model models one or more upper layers of the patterned structure corresponding to the time-filtered wavelength-domain measurement data.

15. The system according to claim 14 wherein the predefined model models the one or more upper layers of the patterned structure excluding all other layers of the patterned structure.

16. The system according to claim 13 wherein the wavelength-domain measurement data include spectral amplitude and spectral phase, and wherein the spectrum processing unit is configured to create the time-domain representation using both the spectral amplitude and the spectral phase.

* * * * *